US010511071B2

United States Patent
Lu et al.

(10) Patent No.: US 10,511,071 B2
(45) Date of Patent: Dec. 17, 2019

(54) LOW-LOSS, LOW-PROFILE DIGITAL-ANALOG PHASE SHIFTER

(71) Applicant: HUGHES NETWORK SYSTEMS, LLC, Germantown, MD (US)

(72) Inventors: Bingqian Lu, Germantown, MD (US); Hamad Alsawaha, Germantown, MD (US); Peter Hou, Germantown, MD (US); Thomas Jackson, Germantown, MD (US); Yilin Mao, Germantown, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 0 days.

(21) Appl. No.: 15/800,731

(22) Filed: Nov. 1, 2017

(65) Prior Publication Data
US 2019/0131680 A1 May 2, 2019

(51) Int. Cl.
| *H01P 1/185* | (2006.01) |
| *H03K 17/74* | (2006.01) |
| *H03H 7/18* | (2006.01) |
| *H03H 7/20* | (2006.01) |

(52) U.S. Cl.
CPC ............. *H01P 1/185* (2013.01); *H03H 7/185* (2013.01); *H03H 7/20* (2013.01); *H03K 17/74* (2013.01)

(58) Field of Classification Search
CPC ................................ H01P 1/185; H03K 17/74
USPC .......................................................... 333/164
See application file for complete search history.

(56) References Cited

U.S. PATENT DOCUMENTS

2005/0270122 A1* 12/2005 Hyman ..................... H01P 1/18
333/164

* cited by examiner

*Primary Examiner* — Robert J Pascal
*Assistant Examiner* — Kimberly E Glenn
(74) *Attorney, Agent, or Firm* — Jones Robb, PLLC

(57) ABSTRACT

A phase shifter having both digital and analog shifting components is disclosed. The digital-analog phase shifter includes an input/output port configured, in part, for receiving an input radio frequency (RF) signal from an external source and outputting a phase shifted RF signal. A digital shifter performs coarse phase shifts of the input RF signal, while an analog shifter variably shift the phase of the input RF signal relative to the coarse phase shift. This produces a phase shifted RF signal having a total phase range that is output is continuously variable from 0° to 360°.

13 Claims, 13 Drawing Sheets

LOW-LOSS, LOW-PROFILE DIGITAL-ANALOG PHASE SHIFTER

BACKGROUND INFORMATION

Phase shifting circuits, or phase shifters, are utilized in a variety of applications and devices to shift the phase of an input signal. For example, the input signal can be a radio frequency (RF) signal or microwave signal that is utilized in a radar system, antenna array, etc. Depending on the specific system and level of complexity, the number of individual phase shifters can exceed tens of thousands.

Phase shifters can be implemented as digital or analog components. Digital phase shifters (or digital shifters) often utilize pin diodes to select between a limited number of discrete phase shifts that can be applied to the input signal. A pin diodes can be switched on and off by changing its resistance from around 100 kΩ to less than 1Ω. This can be achieved, for example, by altering voltage bias of a pin diode from forward bias to reverse bias direction, or vice versa. The number of discrete phase shifts are often described in terms of an exponential value based on the number of bits in the digital phase shifter (or digital shifter). For example, a two-bit digital shifter would be represented as $2^n$, where n is the number of bits, thus providing a total of 4 possible states. Similarly, a three-bit digital shifter would provide 8 discrete states (i.e., $2^3=8$), a four-bit digital shifter would provide 16 discrete states (i.e., $2^4=16$), a five-bit digital shifter would provide 32 states (i.e., $2^5=32$), etc. A three-bit digital filter with a 360° range could, for example, implement the following discrete states (or phase shifts): 45°, 90°, 135°, 180°, 225°, 270°, 315°, 360°.

Digital shifters, however, have several drawbacks. The resolution is limited because number states are discrete. Using the above example, phase shifts ranging from 46° to 89° are not possible. Digital shifters are also current controlled components. In complex antenna configurations that require tens of thousands of digital shifters, the power requirements can result in heating and thermal interference problems. Digital shifters also have an insertion loss that increases with the number of bits and with frequency increases. In the Ka band, for example a four-bit digital shifter has an insertion loss of around –3.2 dB and a six-bit digital shifter has an insertion loss of –5.2 dB. Such losses can be intolerable for efficiency sensitive systems.

Analog phase shifters (or analog shifters) often utilize a varactor diode (or simply varactor) to provide continuous phase shifts within a particular range. Varactors operate in a reverse biased condition providing a junction capacitance that varies based on applied voltage. The phase shift can be changed continuously with control input, thereby providing unlimited resolution with monotonic performance. Unlike digital shifters, an analog shifter could provide continuous phase shifts from 45° to 90° with a high level of precision (e.g., 45.00001°, 45.0001°, 45.001°, etc.), based on the applied voltage increments. Varactors are also voltage controlled components with minimal (or negligible) power requirements.

There are several drawbacks associated with analog shifters. Varactors have a breakdown voltage and their variable junction capacitance is limited by the breakdown voltage. This results in limited range of phases that can be covered (up to about 100°). Thus, sufficient phase shifts cannot be provided to cover the full 360° range without excessive signal loss.

Based on the foregoing, there is a need for an approach for providing continuous phase shifts over the full 360° range with minimal insertion loss and minimal power requirements.

BRIEF SUMMARY

An apparatus and method are disclosed for providing continuous phase shifts to an input signal, such as a radio frequency signal. According to an embodiment, the apparatus includes an input/output port configured, in part, for receiving an input radio frequency (RF) signal from an external source and outputting a phase shifted RF signal; a digital shifter for performing coarse phase shifts of the input RF signal; and an analog shifter for variably shifting the phase of the input RF signal within a predetermined range, relative to the coarse phase shift, to produce the phase shifted RF signal, wherein the total phase range of the phase shifted RF signal that is output is continuously variable from 0° to 360°.

According to another embodiment, the apparatus includes an input/output port configured to: receive an input RF signal from an external source, supply the input RF signal along a first signal path and along a second signal path, and output a phase shifted RF signal; a digital shifter for selectively performing a coarse phase shift of the input RF signal on the first signal path; a first analog shifter for variably shifting the phase of the input RF signal on the first signal path within a predetermined range relative to the coarse phase shift to produce a first phase shifted signal; and a second analog shifter for variably shifting the phase of the input RF signal on the second signal path within a predetermined range to produce a second phase shifted signal, wherein the phase shifted RF signal output by the input/output port comprises at least one of the first phase shifted signal, and both the first phase shifted signal and the second phase shifted signal, and wherein the total phase range of the phase shifted RF signal that is output is continuously variable from 0° to 360°.

According to an embodiment, the method includes receiving an input radio frequency (RF) signal from an external source; performing coarse phase shifts of the input RF signal using a digital shifter; variably shifting the phase of the input RF signal within a predetermined range, relative to the coarse phase shift, to produce the phase shifted RF signal using an analog shifter; and outputting a phase shifted RF signal, wherein the total phase range of the phase shifted RF signal that is output is continuously variable from 0° to 360°.

According to another embodiment, the method includes receiving an input RF signal from an external source; supplying the input RF signal along a first signal path and along a second signal path; performing a coarse phase shift of the input RF signal on the first signal path using a digital shifter; variably shifting the phase of the input RF signal on the first signal path within a predetermined range relative to the coarse phase shift, using a first analog shifter, to produce a first phase shifted signal; selectively enabling a second analog shifter; variably shifting the phase of the input RF signal on the second signal path within a predetermined range to produce a second phase shifted signal; and outputting a phase shifted RF signal, wherein the phase shifted RF signal comprises at least one of the first phase shifted RF signal, and both the first phase shifted signal and the second phase shifted signal, and wherein the total phase range of the phase shifted RF signal that is output is continuously variable from 0° to 360°.

The foregoing summary is only intended to provide a brief introduction to selected features that are described in greater detail below in the detailed description. As such, this summary is not intended to identify, represent, or highlight features believed to be key or essential to the claimed subject matter. Furthermore, this summary is not intended to be used as an aid in determining the scope of the claimed subject matter.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION

An apparatus and method are disclosed for providing continuous phase shifts to an input signal. In the following description, for purposes of explanation, numerous specific details are set forth in order to provide a thorough understanding of the disclosed embodiments. It will become apparent, however, to one skilled in the art that various embodiments may be practiced without these specific details or with an equivalent arrangement. In other instances, well-known structures and devices are shown in block diagram form in order to avoid unnecessarily obscuring the various embodiments.

Figure 1:
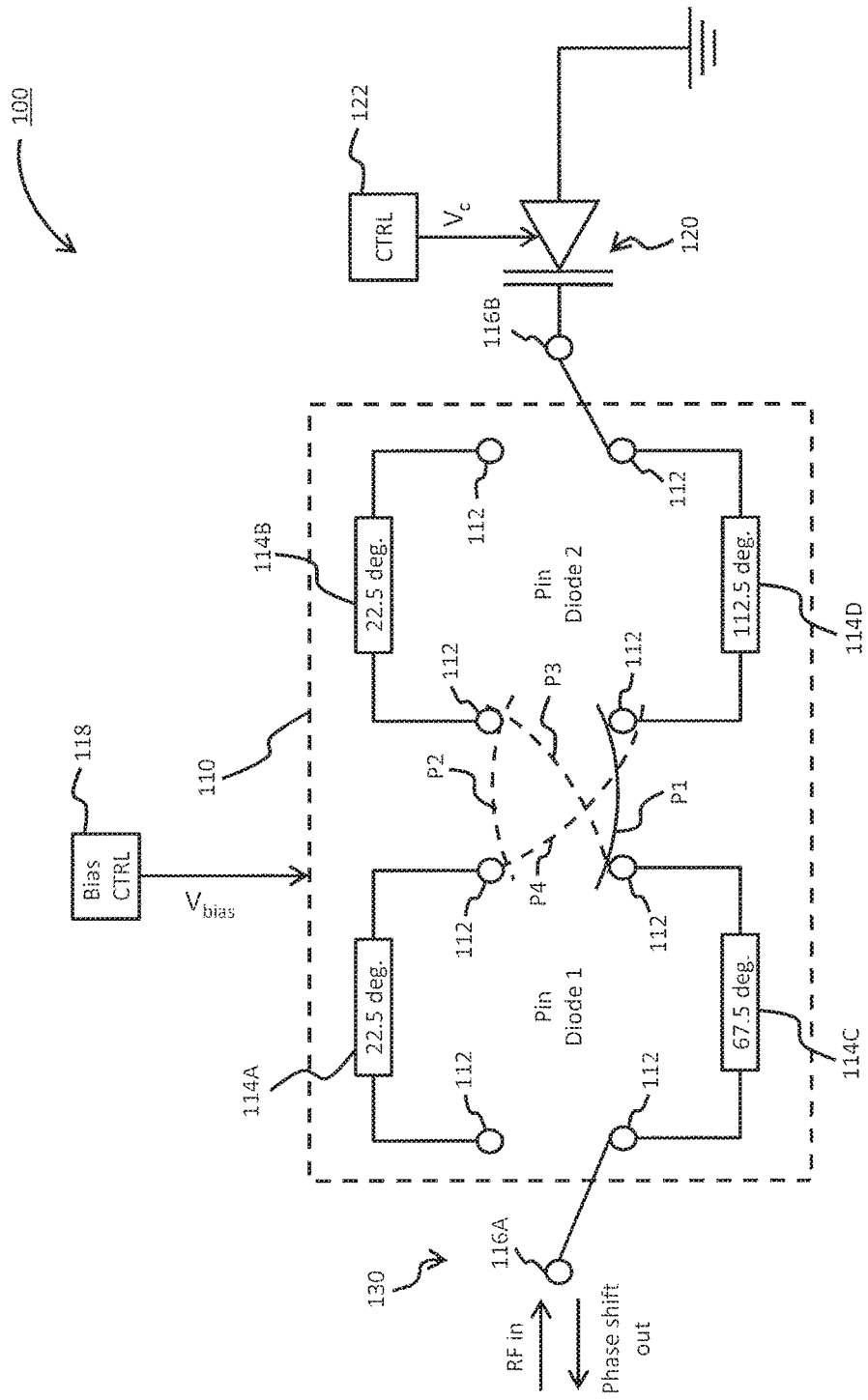
FIG. 1 is a diagram of a digital-analog phase shifter according to one embodiment.

FIG. 1 is a diagram of a digital-analog phase shifter 100 in accordance with at least one embodiment. The digital-analog phase shifter 100 includes a digital shifter 110, an analog shifter 120, and an input/output port 130. According to the illustrated embodiment, the digital shifter 110 includes a plurality of switching elements 112, as well as four phase delay loads 114. Depending on the particular implementation, the switching elements 112 can be configured as various components such as pin diodes, metal-oxide-semiconductor field-effect transistors (MOSFETs), Bipolar Junction Transistors (BJTs), etc. For example, the first phase delay load 114A can be in the form of a λ/16 transmission line, where λ=360°. Thus, the transmission line would be configured to delay the phase of a signal passing therethrough by 22.5°. The second phase delay line 114B can also be in the form of a transmission line configured to delay the phase of the signal by 22.5°. The third phase delay load 114C can be configured as a 3λ/16 transmission line that is configured to provide a 67.5° delay to the signal passing therethrough. The fourth phase delay load 114D can be configured as a 5λ/16 transmission line that is configured to provide a 112.5° delay to the signal passing therethrough. Depending on the specific implementation, other components and/or circuitry can be used to generate the necessary phase delay.

As further illustrated in FIG. 1, the digital shifter also includes two gate switches 116 which direct the input RF signal into, and out of, the digital shifter 110. More particularly, the first gate switch 116A is configured to direct the input RF signal to either the first phase delay load 114A or the third phase delay load 114C. The second gate switch 116B is similarly configured to selectively direct the input RF from either the second phase delay load 114B or the fourth phase delay load 114D to the analog shifter 120. The first gate switch 116A and the second gate switch 116B can be configured as pin diodes, metal-oxide-semiconductor field effect transistors (MOSFETs), bipolar junction transistors (BJTs), etc. According to at least one embodiment, a bias controller 118 can be provided to supply the voltage ($V_{bias}$) necessary to generate the DC bias required to control the switching elements 112 (or pin diodes). The bias controller 118 can be configured to independently supply the necessary voltage to each switching element. Alternatively, a separate bias controller 118 can be used for each switching element 112.

While FIG. 1 illustrates a specific implementation which provides specific values for the phase delay loads 114, it should be noted that various other values can be selected depending on the particular application, desired phase shift range, signal loss, etc. For example, depending on the frequency of the input RF signal and the desired phase shifting range, different phase delay loads 114 can be utilized in order to minimize the total signal loss in the preferred phase shift range. Furthermore, the phase delay loads 114 can be selected such that an overlap occurs within different parts of the phase shift range. Since the overlap would correspond to different combinations of the phase delay loads 114, the signal loss can differ between the different phase shift ranges within the overlap. Accordingly, the phase shift of the input RF signal can be selected to minimize the total signal loss within a desired phase shift sub range.

According to the illustrated embodiment, the digital shifter 110 can be a 2-bit shifter capable of providing four discrete phase shifts. Each discrete phase shift is achieved based on the path traveled by the input RF signal. When the input RF signal travels along a first switch position P1, it passes through the third phase delay load 114C and the fourth phase delay load 114D. It should be noted that the first gate switch 116A is configured to selectively direct the input RF signal to the third phase delay load 114C when the first switch position is desired. The input RF signal experiences a coarse phase shift of 180°, and the second gate switch 116B is configured to direct the input RF signal from the fourth phase delay load 114D to the analog shifter 120. As will be discussed in greater detail below, additional phase shifts are provided by the analog shifter 120. The input signal subsequently returns through the same path and experiences a second coarse phase shift of 180° before being output through the input/output port 130. Thus, when the switching elements 112 are engaged in switch position P1, the input RF signal passes through the third phase delay load 114C and the fourth phase delay load 114D, which results in a discrete phase shift of 360°.

When the switching elements 112 are in switch position P2, the first phase delay load 114A and the second phase delay load 114B are enabled. The input RF signal experiences a 45° phase shift while traveling to the analog shifter 120, and receives a second 45° phase shift along the return path to the input/output port 130. This results in a total phase shift of 90°. When the switching elements 112 are in switch position P3, the third phase delay load 114C and the second phase delay load 114B are enabled. The input RF signal experiences a total phase shift of 180°. When the switching elements 112 are in switch position P4, the first phase delay load 114A and the fourth phase delay load 114D are engaged. The input RF signal receives a 135° phase shift to reach the analog shifter 120 and a second 135° phase shift returning to the input/output port 130. The total phase shift of the output signal is 270°.

As previously discussed, the digital shifter 110 provides discrete phase shifts to the input RF signal. There is no ability to achieve a particular phase shift between any two of the discrete values (360°, 90°, 180°, 270°). According to the illustrated embodiment, the analog shifter 120 can provide an additional phase range that is continuously at variable. Since the analog shifter 120 receives its input from the digital shifter 110, the specific phase range is adjustable relative to the specific phase shift previously performed by the digital shifter 110 based on the position of the switching elements 112. According to at least one embodiment, the analog shifter 120 has phase range of 90°-110°. According to other embodiments, the analog shifter 120 can be configured with a wider phase range (e.g., 150°-180°, or greater), for example, by utilizing multiple varactors.

According to at least one embodiment, the analog shifter 120 can be configured as a varactor whose capacitance can be adjusted based on a control voltage $V_c$. For example, a voltage controller 122 can be utilized to supply a control voltage $V_c$ to the varactor in order to vary its junction capacitance. This results in continuous phase changes to the input signal relative to the voltage being supplied by the voltage controller 122. Depending on the specific implementation, the resolution of the analog shifter 120 can be finely tuned to achieve very precise phase shifts for the input signal. If the total voltage range of the voltage controller is 1V -10V, for example, adjustments can be made by increments of 0.1V, 0.01V, 0.001V, etc. This allows very fine incremental changes by the analog shifter 120 as the phase shift is continually varied. According to the illustrated embodiment, the analog shifter 120 can be grounded at one end in order to avoid the need to perform any impedance matching for the circuit. Thus, the total signal lost for the digital-analog shifter can be reduced.

Figure 2A:
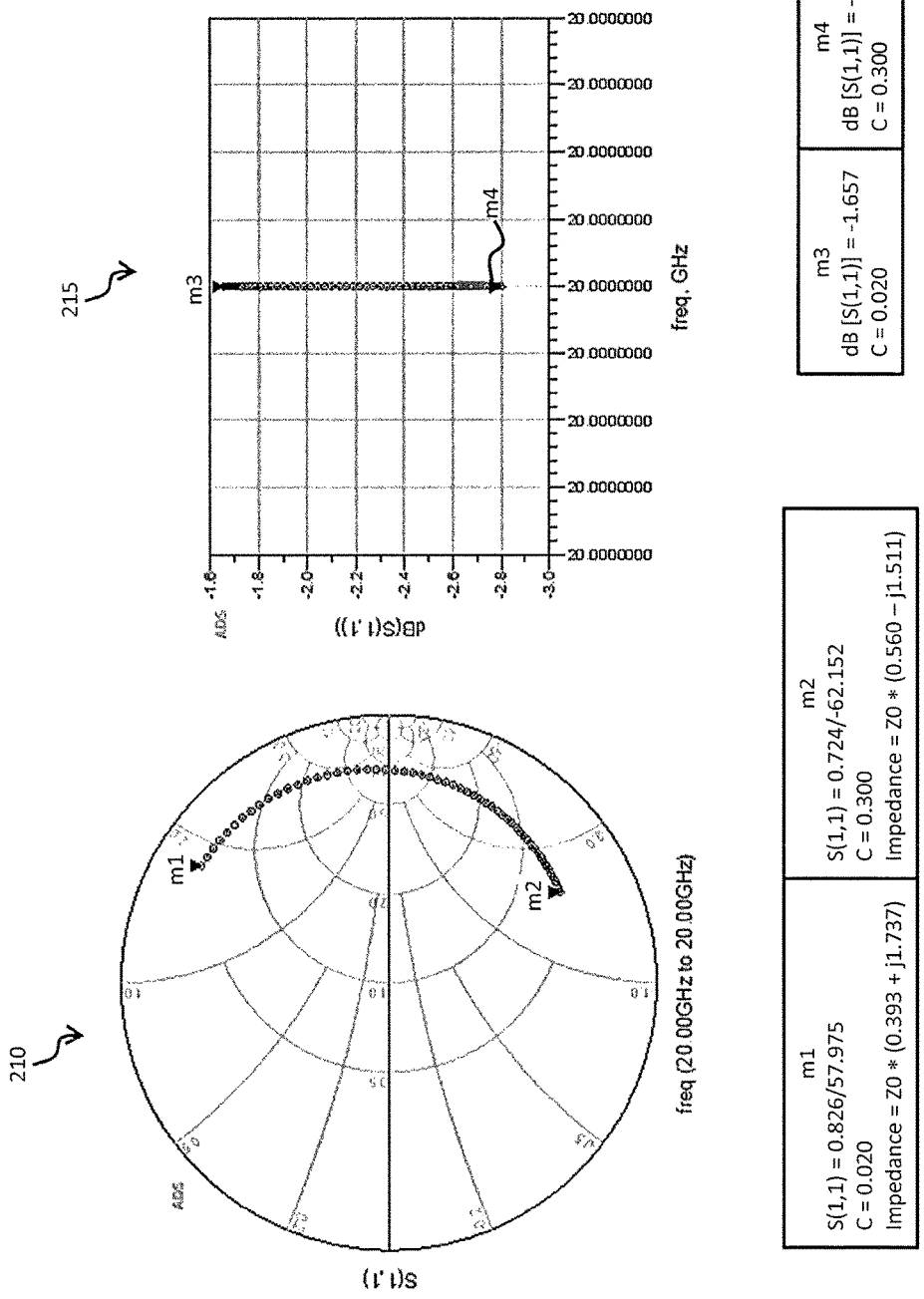
FIG. 2A is a diagram of a first phase range of the digital and analog phase shifter of FIG. 1, according to one embodiment.

FIG. 2A is a diagram 210 of a first phase range achievable by the digital-analog phase shifter 100, in accordance with at least one embodiment. The digital shifter 110 is controlled to facilitate the first coarse phase shift by selecting switch position P1. As previously discussed, the first coarse phase shift (i.e., switch position P1) results in the input RF signal being directed along the path which incorporates the third phase delay load 114C and the fourth phase delay load 114D. Referring to Table 1 (below), it can be seen that the first coarse phase shift (P1) produced by the digital shifter 110 is 360°.

TABLE 1

| | D1 | D2 | Coarse shift | Combined phase shift range |
|---|---|---|---|---|
| P1 | 1 | 1 | 360° | 57.975° to −62.152° |
| P2 | 0 | 0 | 90° cw | −24.293° to −150.826° |
| P3 | 1 | 0 | 180° cw | −108.952° to 100.389° |
| P4 | 0 | 1 | 270° cw | 153.640° to 12.104° |

The analog shifter 120 is then utilized to provide a range of phase shifts relative to the coarse phase shift performed by the digital shifter 110. According to the illustrated implementation, the voltage controller 122 supplies a control voltage $V_c$ to the varactor 120 in order to vary its junction capacitance from C=0.020 pF to 0.300 pF. At point m1, the junction capacitance is C=0.020 pF, and a phase shift of 57.975° is achieved. As the control voltage $V_c$ is adjusted to achieve a capacitance of C=0.300 pF at point m2, the phase shift continuously changes clockwise to a final value of −62.152°. As further illustrated in the signal loss plot 215, the signal loss within the first phase shift range varies from −1.656 dB at point m3 to −2.800 dB at point m4.

Figure 2B:
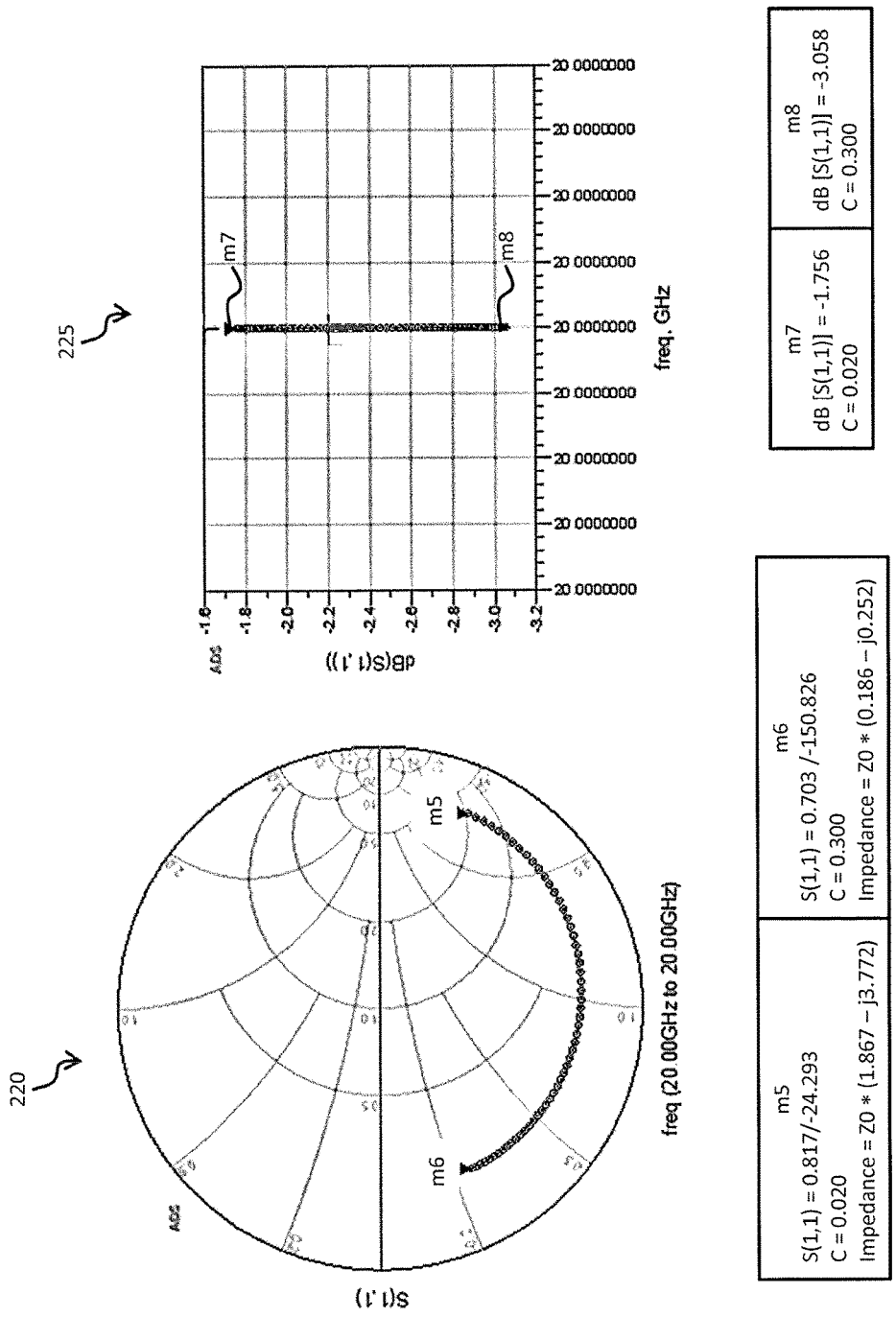
FIG. 2B is a diagram of a second phase range of the digital and analog phase shifter of FIG. 1, according to one embodiment.

FIG. 2B is a diagram 220 of a second phase range achievable by the digital-analog phase shifter 100. The second phase range results by first controlling the digital shifter 110 to perform the second coarse phase shift. This corresponds to switch position P2. As previously discussed, the second coarse phase shift (P2) results in the input RF signal being directed along the path which incorporates the first phase delay load 114A and the second phase delay load 114B. Referring to the Table 1, it can be seen that the second coarse phase shift (P2) produced by the digital shifter 110 is 90° in the clockwise direction. The analog shifter 120 is then utilized to provide a range of phase shifts relative to the coarse phase shift performed by the digital shifter 110. According to the illustrated implementation, the voltage controller 122 applies a control voltage $V_c$ to the varactor 120 in order to vary its junction capacitance from C=0.020 pF to −0.300 pF. At point m5, the junction capacitance is C=0.020 pF, and a phase shift of −24.293° is achieved. As the control voltage $V_c$ is adjusted to achieve a capacitance of C=0.300 pF at point m6, the phase shift continually changes clockwise to a final value of −150.826°. A signal loss plot 225 illustrates the signal loss within the second phase shift range to vary from −1.756 dB at point m7 to −3.058 dB at point m8.

Figure 2C:
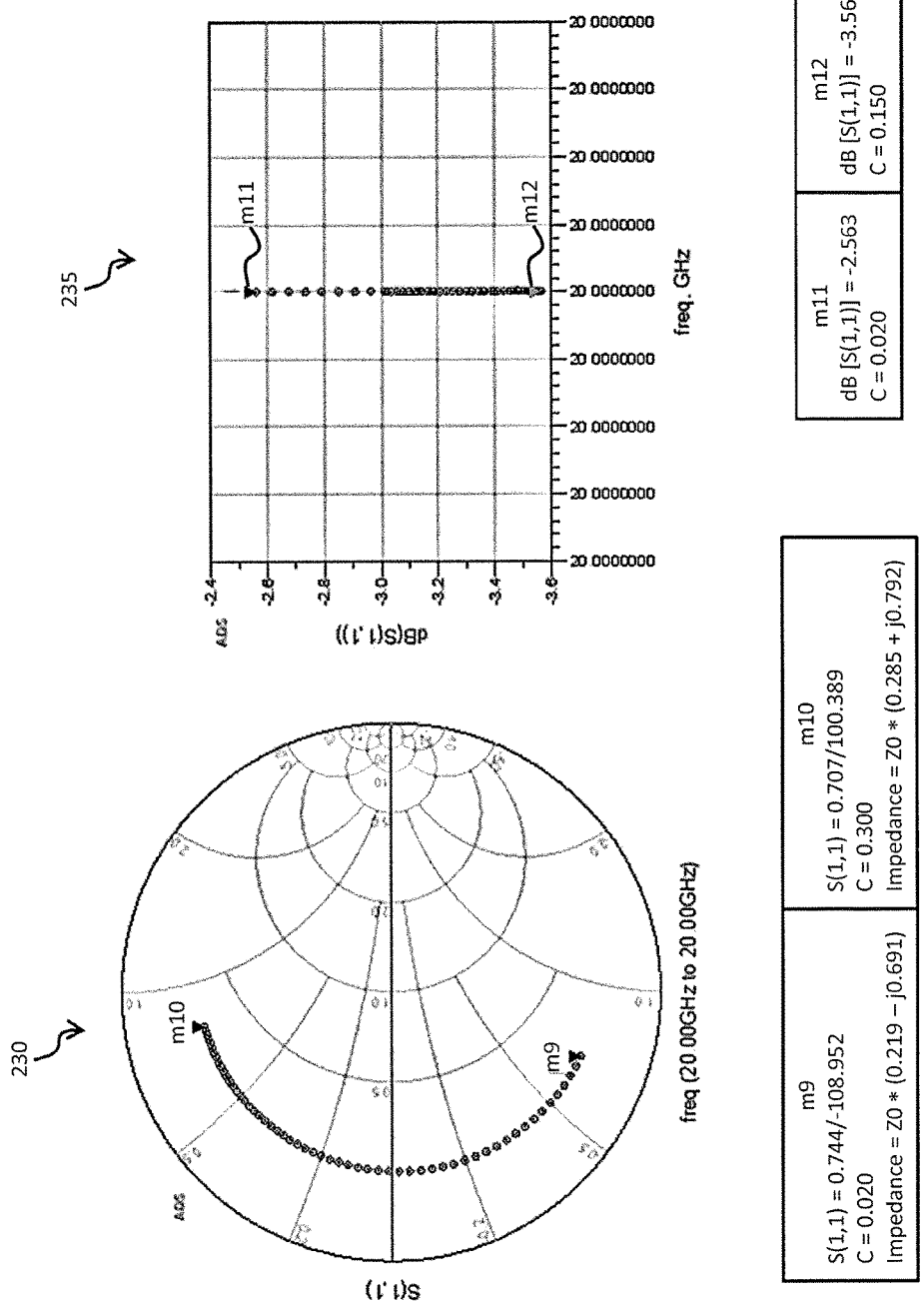
FIG. 2C is a diagram of a third phase range of the digital and analog phase shifter of FIG. 1, according to one embodiment.

FIG. 2C is a diagram 230 of a third phase range achievable by the digital-analog phase shifter 100. The third phase range is achieved by first controlling the digital shifter 110 to perform the third coarse phase shift, corresponding to switch position P3. As previously discussed, the third coarse phase shift (P3) results in the input RF signal being directed along the path which incorporates the third phase delay load 114C and the second phase delay load 114B. Referring to the Table 1, it can be seen that the third coarse phase shift (P3) produced by the digital shifter 110 is 180° in the clockwise direction. The analog shifter 120 is then utilized to provide a range of phase shifts relative to the coarse phase shift performed by the digital shifter 110. According to the illustrated implementation, the voltage controller 122 applies a control voltage $V_c$ to the varactor 120 in order to vary its junction capacitance from C=0.020 pF to 0.300 pF. At point m9, the junction capacitance is C=0.020 pF, and a phase shift of −108.952° is achieved. As the control voltage $V_c$ is adjusted to achieve a capacitance of C=0.300 pF at point m10, the phase shift continually changes clockwise to a final value of 100.389°. FIG. 2C further illustrates a signal loss plot 235 showing the signal loss within the third phase shift range varies from −2.563 dB at point m11 to −3.566 dB at point m12.

Figure 2D:
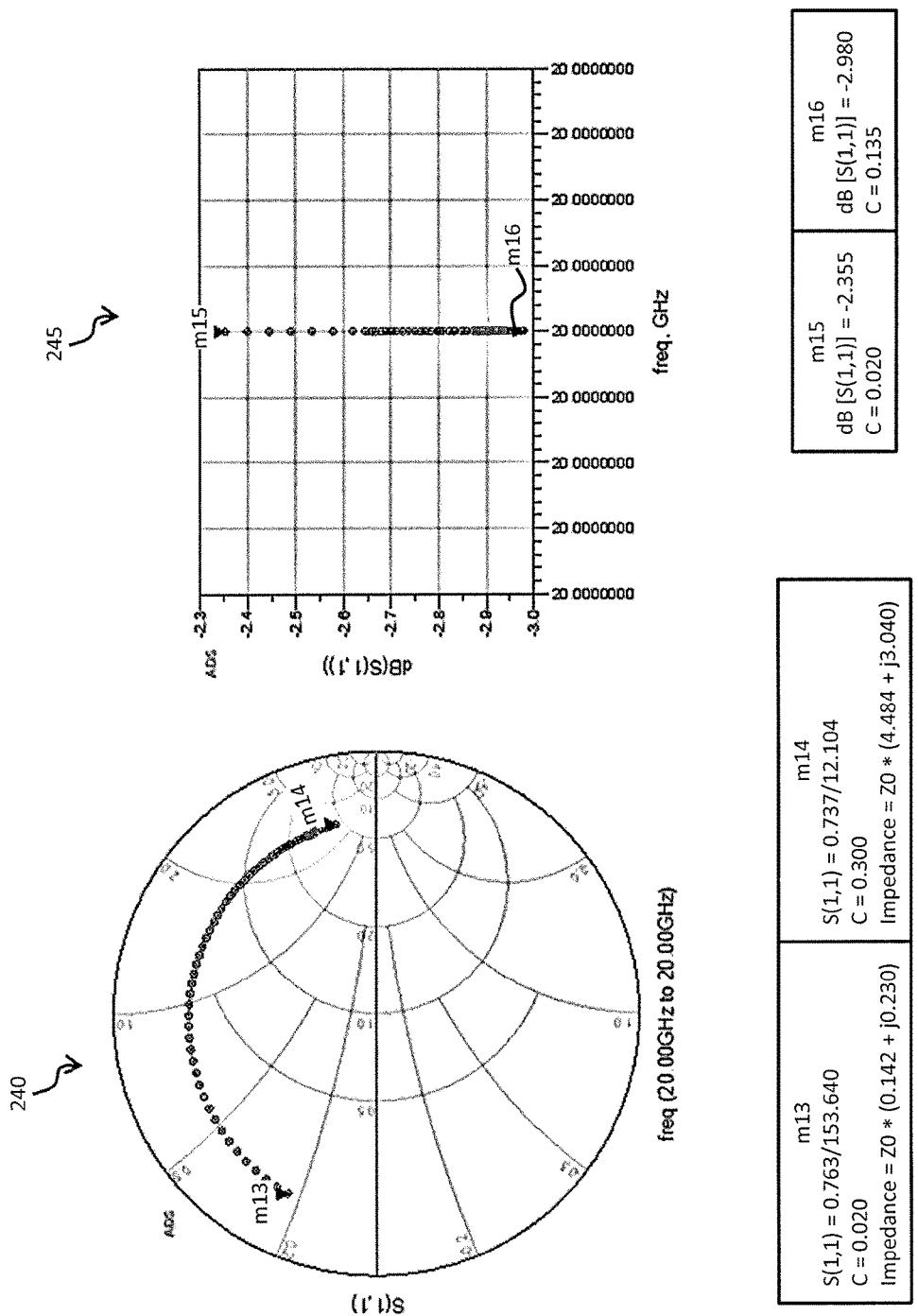
FIG. 2D is a diagram of a fourth phase range of the digital and analog phase shifter of FIG. 1, according to one embodiment.

FIG. 2D is a diagram 240 of a fourth phase range achievable by the digital-analog phase shifter 100. The fourth phase range is achieved by first controlling the digital shifter 110 to perform the fourth coarse phase shift (i.e., switch position P4). The fourth coarse phase shift (P4) results in the input RF signal being directed along the path which incorporates the first phase delay load 114A and the fourth phase delay load 114D. Referring to the Table 1, the fourth coarse phase shift (P4) produced by the digital shifter 110 is 270° in the clockwise direction. The analog shifter 120 is then utilized to provide a range of phase shifts relative to the coarse phase shift performed by the digital shifter 110. According to the illustrated implementation, the voltage controller 122 applies a control voltage $V_c$ to the varactor 120 in order to vary its junction capacitance from C=0.020 pF to 0.300 pF. At point m13, the junction capacitance is C=0.020 pF, and a phase shift of 153.640° is achieved. As the control voltage $V_c$ is adjusted to achieve a capacitance of C=0.300 pF at point m14, the phase shift continually changes clockwise to a final value of 12.104°. The signal loss plot 245 shows that signal loss within the fourth phase shift range varies from −2.355 dB at point m15 to −2.980 dB at point m16.

As illustrated in FIGS. 2A-2D, a full 360° phase shift range can be achieved for the input RF signal by combining the first, second, third, and fourth phase ranges. Furthermore, some overlap exists in the phase of adjacent phase ranges. For example, the first phase range (FIG. 2A) has an overlap with the second range from −24.293° to −62.152°. The signal loss at point m4 in the first phase range is −2.800 dB, while the signal loss at point m3 in the second phase range is −1.756 dB. According to at least one embodiment, if the desired phase shift for the input RF signal falls within the overlapping range, it is possible to control the digital-analog filter 100 to reach the desired phase shift using the second phase range in FIG. 2B. Such a selection can result in a lower signal loss while achieving the same phase shift. Similarly, it is possible to select the phase range which results in the lower signal loss if the desired phase shift is within an overlapping region of any two adjacent phase ranges.

While FIGS. 2A-2D illustrate phase shift ranges utilizing an input RF signal having a frequency of 20.00 GHz, it should be noted that the input RF signal is in no way limited to 20.00 GHz. Furthermore, various embodiments can provide for varying the amount of overlap between adjacent phase ranges by adjusting the frequency of the input RF signal and/or the number of varactors in the analog shifter 120. Desired frequency shifts can then be selected based on the phase range which provides the lower signal loss within the overlapping regions.

Figure 3:
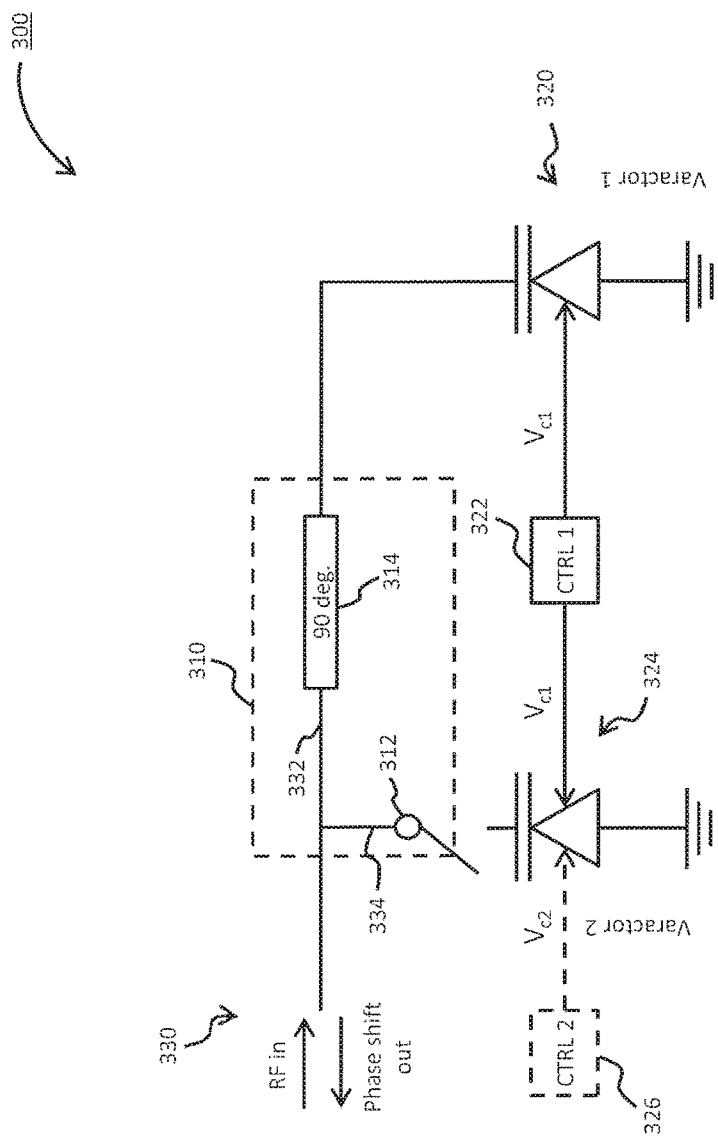
FIG. 3 is a diagram of a digital-analog phase shifter according to one embodiment.

FIG. 3 is a diagram illustrating a digital-analog phase shifter 300 in accordance with one or more embodiments. The digital-analog phase shifter 300 includes a digital shifter 310, a first analog shifter 320, a second analog shifter 324, and an input/output port 330. According to the illustrated embodiment, the digital shifter 310 includes one switching element 312 and a phase delay load 314. According to the illustrated implementation, the phase delay load 314 can be configured as a λ/4 transmission line which provides a 90° delay to the input RF signal. Thus, the input RF signal is shifted 90° when traveling to the first analog shifter 320, and another 90° when returning to the input/output port 330. This results in a total phase shift of 180° in the output signal.

According to the illustrated embodiment, the input RF signal is split such that it travels along a first signal path 332 and a second signal path 334. Along the first signal path 332, the digital shifter 310 performs a coarse phase shift of the input RF signal which is provided to the first analog shifter 320. According to the illustrated embodiment, the first analog shifter 320 can be configured as a first varactor whose junction capacitance is variable based on an input voltage. A first controller 322 can be utilized to supply the first control voltage $V_{c1}$ to the first analog shifter 320 (or varactor) in order to variably adjust the capacitance. This results in a phase shift range that is continuously variable based on the first control voltage $V_{c1}$ that is supplied, and relative to the initial coarse phase shift performed by the digital shifter 310. The phase shifted signal can then be returned to the input/output port 330.

As illustrated in FIG. 3, the digital shifter 310 includes a switching element 312 which selectively supplies the input RF signal along the second signal path 334 to a second analog shifter 324. The input RF signal on the second signal path 334 does not experience a coarse phase shift from the digital shifter 310. Rather, only the second analog shifter 324 is utilized to generate a phase shift range for the input RF signal to produce a second phase shifted signal that is returned along the second signal path 334. The first phase shifted signal is combined with the second phase shifted signal, and subsequently output via the input/output port 330.

Thus, in a first state, the switching element 312 is disabled, and no phase shift occurs to the signal traveling on the second signal path 334. Phase shifting only occurs along the first signal path 332. More particularly, the input RF signal travels along the first signal path 332, experiences a coarse phase shift by the phase delay load 314, and experiences a continuous range of phase shifts generated by the first analog shifter 320. The input signal is then returned through the phase delay load 314 which results in an additional phase change. This produces a first phase shifted signal. In this particular state, the phase shifted RF signal that is output at the input/output port 330 only includes the first phase shifted signal passing along the first signal path 332. In a second state, the switching element 312 is enabled, and allows the input RF signal to additionally travel along the second signal path 334. The second analog shifter 324 is controlled to generate a second phase shift range, and returns a second phase shifted signal along the second signal path 334. The phase shifted RF signal that is output at the input/output port 330 is a combination of the first phase shifted signal traveling on the first signal path 332 and the second phase shifted signal traveling along the second signal path 334.

As previously discussed, the first analog shifter 320 can be controlled by the first controller 322, which supplies a first control voltage $V_{c1}$ to variably adjust the junction capacitance of the varactor. According to at least one embodiment, the first controller 322 can also supply the first control voltage $V_{c1}$ to the second analog shifter 324. Accordingly, when the switching element 312 enables the second signal path 334, the first control voltage $V_{c1}$ utilized to control the first analog shifter 320 is also utilized to control the second analog shifter 324. According to other embodiments, however, a second voltage controller 326 can be utilized to supply a second control voltage $V_{c2}$ which adjusts the junction capacitance of the second analog shifter 324. According to such embodiments, each of the analog shifters (320, 324) can be independently controlled to generate distinct or identical phase shift ranges.

Figure 4A:
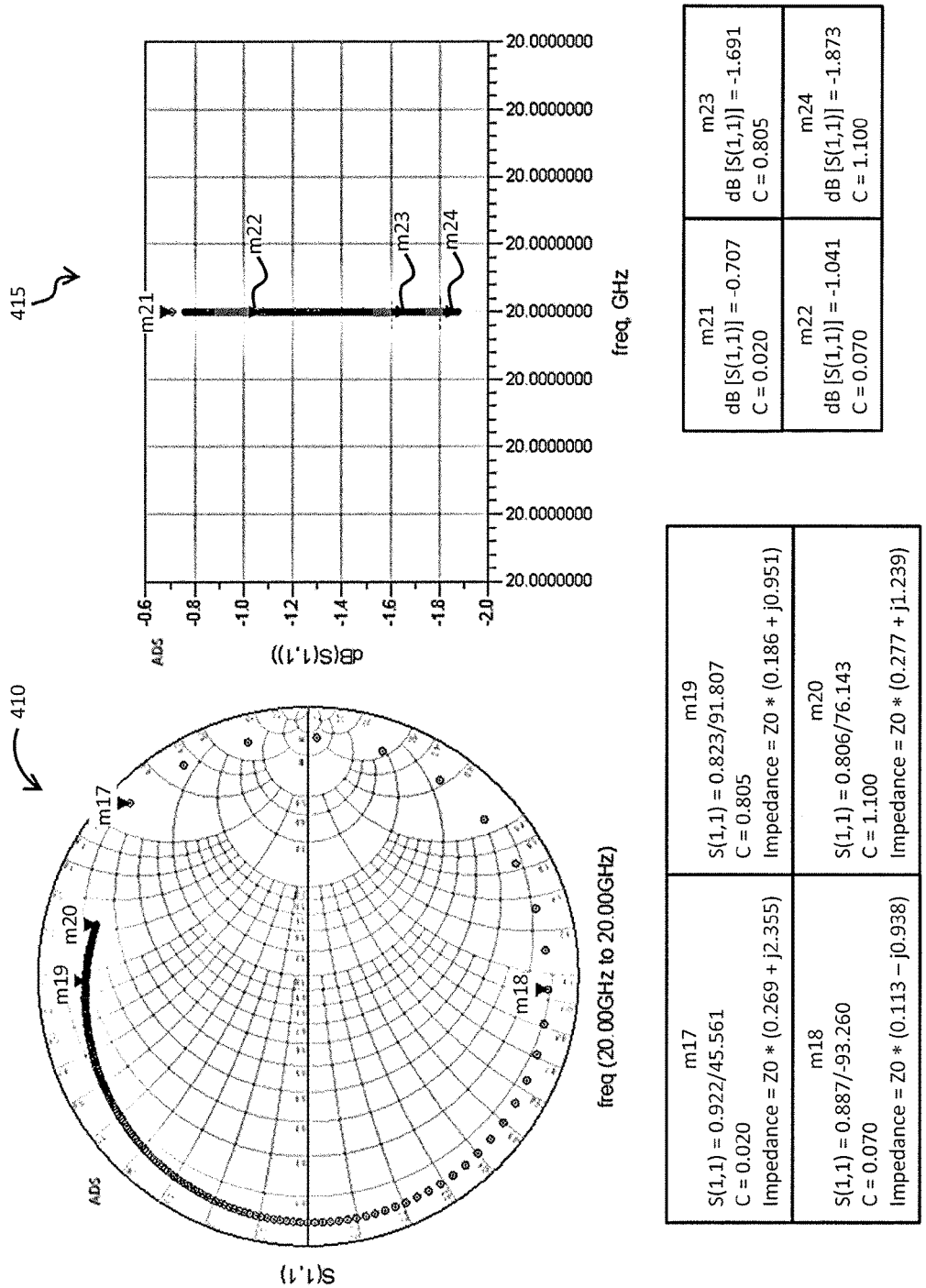
FIG. 4A is a diagram of a first phase range and corresponding signal loss of the digital and analog phase shifter of FIG. 3, according to one embodiment.

FIG. 4A illustrates diagram 410 showing a first phase shift range and corresponding signal loss plot 415 showing a signal loss that is achieved by the digital-analog phase shifter 300 of FIG. 3. The first phase range requires phase shifts on both the first signal path 332 and the second signal path 334. Accordingly, the digital shifter 310 is controlled to impart a coarse phase shift on the input RF signal along the first signal path 332, and supply the first phase shifted signal to the first analog shifter 320 (or varactor). The digital shifter 310 also causes the switching element 312 (or pin diode) to supply the input RF signal to the second analog shifter 324 (or varactor).

According to the illustrated embodiment, the phase delay load 314 results in a coarse phase shift of 90°. The first analog shifter 320 is then utilized to provide a range of phase shifts relative to the coarse phase shift performed by the digital shifter 310. During this process, the first voltage controller 322 applies a first control voltage $V_{c1}$ to the first analog shifter 320 in order to vary its junction capacitance from C=0.020 pF-1.1 pF. This results in a first phase shifted signal. Simultaneously, the first voltage controller 322 applies the first control voltage $V_{c1}$ to the second analog shifter 324 in order to provide a range of phase shifts relative to the phase of the input RF signal. This results in a second phase shifted signal that is combined with the first phase shifted signal. The combined signals are output as the phase shifted RF signal.

At point m17, the junction capacitance of the first analog shifter 320 and the second analog shifter 324 are each C=0.020 pF, and a phase shift of 45.561° is achieved for the phase shifted RF signal that is output. As the first control voltage $V_{c1}$ is adjusted to achieve a capacitance of C=1.1 pF at point m20 for the first analog shifter 320 and the second analog shifter 324, the phase shift continuously changes clockwise to a final value of 76.143°. As further illustrated in FIG. 4A, the signal loss within the first phase shift range varies from −0.707 dB at point m21 to −1.873 dB at point m24.

At point m18, the junction capacitance of the first analog shifter 320 and the second analog shifter 324 are each C=0.070 pF, and a phase shift of −93.260° is achieved for the phase shifted RF signal that is output. The corresponding signal loss is −1.041 dB at point m22. At point m19, the junction capacitance of the first analog shifter 320 and the second analog shifter 324 are each C=0.805 pF, and a phase shift of 91.807° is achieved for the phase shifted RF signal that is output. The corresponding signal loss is −1.691 dB at point m23.

Figure 4B:
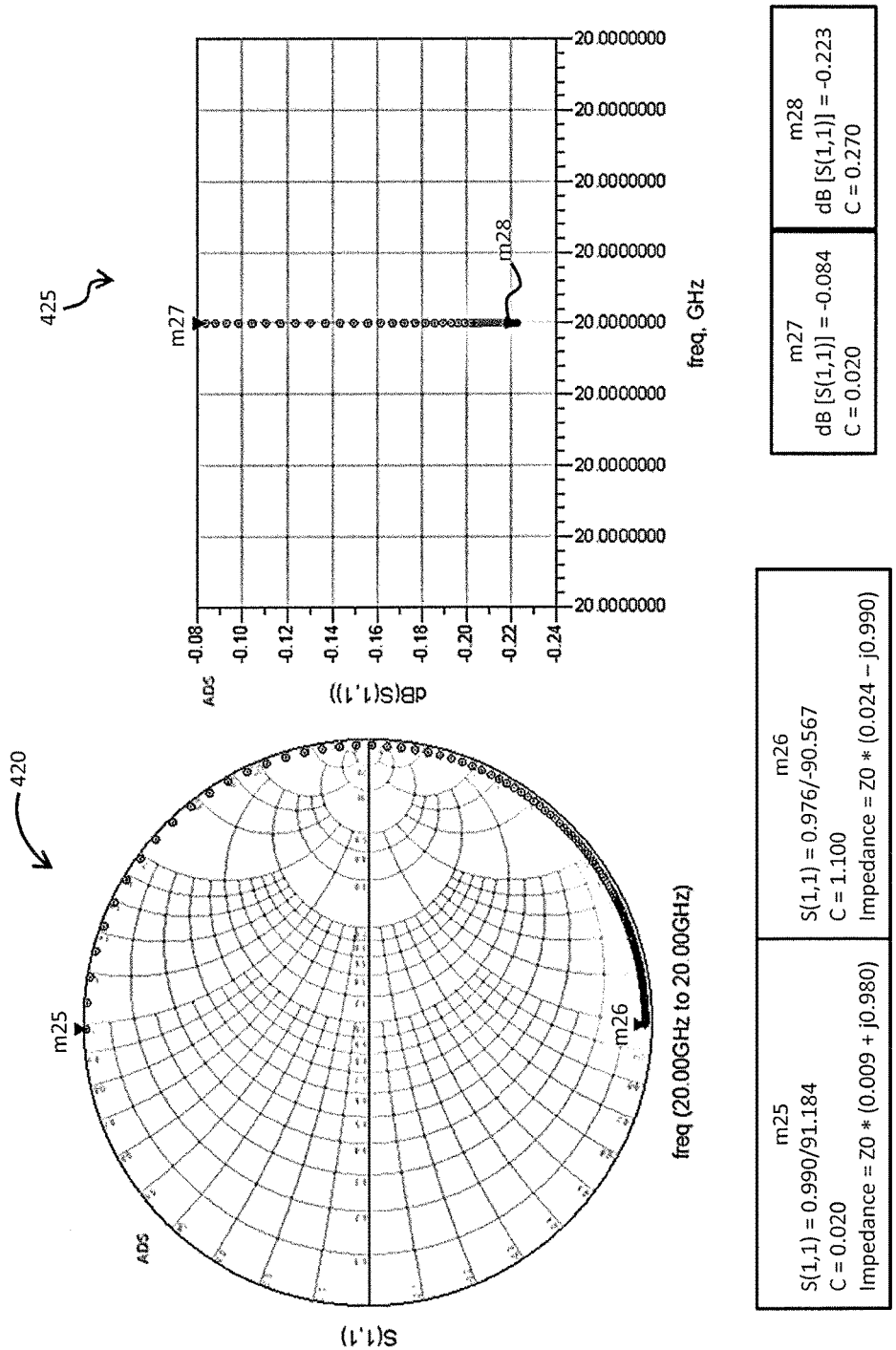
FIG. 4B is a diagram of a second phase range and corresponding signal loss of the digital and analog phase shifter of FIG. 3, according to one embodiment.

FIG. 4B illustrates diagram 420 showing a first phase shift range and corresponding signal loss plot 425 showing a signal loss that is achieved by the digital-analog phase shifter 300 of FIG. 3. The second phase range only requires phase shifts on the first signal path 332. Accordingly, the digital shifter 310 is controlled to impart a coarse phase shift on the input RF signal on the first signal path 332, and supply the resulting signal to the first analog shifter 320 (or varactor). The digital shifter 310 also places the pin diode 312 (or switching element) in the OFF position, thereby preventing the input RF signal from being supplied to the second analog shifter 324 (or varactor). According to the illustrated embodiment, the coarse phase shift is 90°. The first analog shifter 320 is then utilized to provide a range of phase shifts relative to the coarse phase shift performed by the digital shifter 310. During this process, the first voltage controller 322 applies a first control voltage $V_{c1}$ to the first analog shifter 320 in order to vary its junction capacitance from C=0.020 pF-1.1 pF. This results in a first phase shifted signal. Since the second analog shifter 324 does not contribute any phase shift, only the first phase shifted signal is output as the phase shifted RF signal.

At point m25, the junction capacitance of the first analog shifter 320 is C=0.020 pF, and a phase shift of 91.184° is achieved for the phase shifted RF signal that is output. As the first control voltage $V_c$ for the first analog shifter 320 is adjusted to achieve a capacitance of C=1.1 pF at point m26, the phase shift continuously changes clockwise to a final value of −90.567°. As further illustrated in FIG. 4B, the signal loss within the second phase shift range varies from −0.084 dB at point m27 to −0.223 dB at point m28.

As illustrated in FIGS. 4A and 4B, a full 360° range of phase shifts is achieved by combining the first and second phase ranges. Furthermore, the first phase range has two overlaps with the second phase range. The first overlap occurs from 91.807° at m19 to 76.143° at m20, and the second overlap occurs from 45.561° at m17 to −90.567° at m26. Such an overlap can advantageously be used to select the state wherein the particular phase range provides the least amount of signal loss. The signal loss in the overlapping region of the first phase range varies from −0.707 dB at point m21 to −1.041 dB at point m22, and from −1.691 dB at point m23 to −1.873 dB at point m24. In contrast, the signal loss in the entire second phase range varies from −0.084 at point m27 to −0.223 dB at point m28.

According to at least one embodiment, if the desired phase shift for the input RF signal falls within the overlapping range, it is possible to control the digital-analog phase filter 300 to reach the desired phase shift using the second phase range in FIG. 4B in order to minimize signal loss. As previously discussed, various embodiments can provide for varying the amount of overlap between adjacent phase ranges, for example, by adjusting the frequency of the input RF signal. Desired frequency shifts can then be selected based on the phase range which provides the lower signal loss within the overlapping regions.

Figure 5:
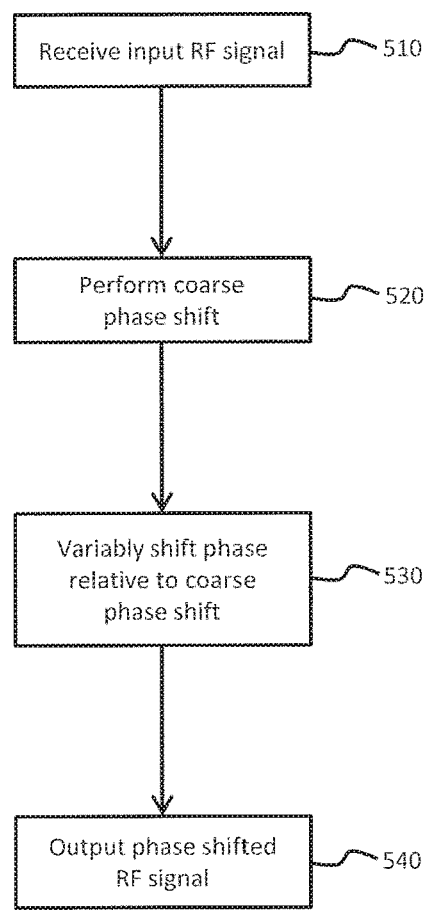
FIG. 5 is a flowchart of a process for shifting the phase of an input signal, according to one embodiment.

FIG. 5 is a flowchart illustrating a process for shifting the phase of an input signal (e.g., an RF signal) in accordance with at least one embodiment. At 510, and input RF signal is received. As previously discussed, this can be achieved via an input/output port of the digital-analog phase shifter. At 520 a coarse phase shift is performed on the input RF signal. This can be achieved, for example, using a 1-bit or 2-bit digital filter. At 530, the phase of the RF signal is variably shifted relative to the coarse phase shift. More particularly, after the coarse phase shift is performed on the input RF signal, it is output directly to an analog shifter such as a varactor. The analog shifter facilitates continuous variations of the phase shift applied to the input RF signal within a predetermined range. Additionally, the phase shift performed by the analog shifter is relative to the coarse phase shift that has previously been performed by the digital shifter. For example, the analog shifter may have a phase shift range of 100°. If the coarse phase shift results in a 90° clockwise shift of the input RF signal's phase, then the phase shift range available from the analog shifter can vary the phase of the input RF signal greater than 90° (90° to 180°), less than 90° (−10° to 90°), or both (40° to 130°). At 540, the phase shifted RF signal is output through the input/output port with a shifted phase that is based on both the coarse phase shift and the variable phase shift.

Figure 6:
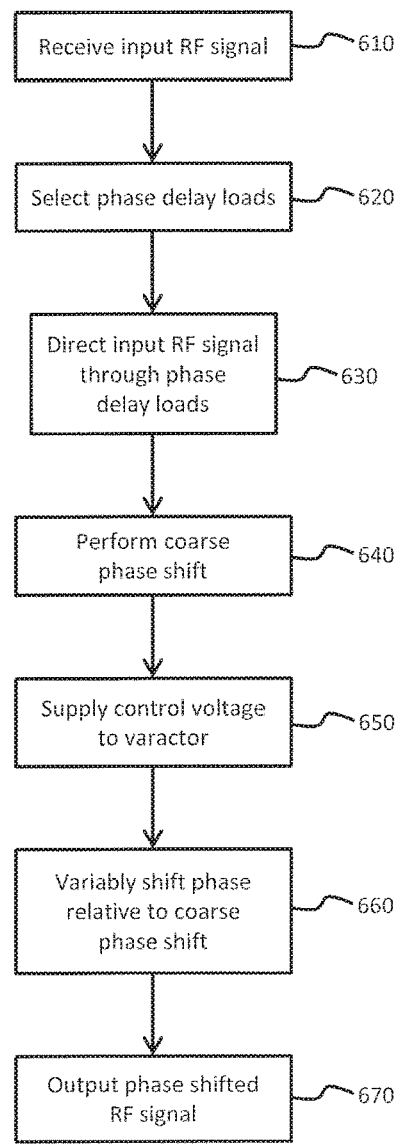
FIG. 6 is a flowchart of a process for shifting the phase of an input signal according to at least one embodiment.

FIG. 6 is a flowchart illustrating a process for shifting the phase of an input signal (e.g., an RF signal) in accordance with one or more embodiments. At 610, and input RF signal is received, for example, at an input/output port of the digital-analog phase shifter. At 620, phase delay loads are selected for the path which the input RF signal will travel. According to at least one embodiment, the phase delay loads can be part of a 2-bit digital filter. Thus, the phase delay loads can be in the form of multiple transmission lines. The 2-bit digital shifter can support four different (or discrete) coarse phase shifts, based on independent bias voltages being supplied to each pin diode from one or more bias controllers. For example, one bias controller can be configured to supply an independent bias voltage to each pin diode. Alternatively, four bias controllers can be configured to supply the bias voltage to respective pin diodes. Four transmission lines can be supplied, for example, within the digital shifter, such that the input RF signal can be directed through four different paths which each incorporate two different transmission lines. Depending on the specific implementation, the four transmission lines may provide distinct phase delays to the input RF signal (i.e., 22.5°, 45°, 67.5°, 112.5°). According to other implementations, multiple transmission lines may provide the same phase delay to the input RF signal (e.g., 22.5°, 22.5°, 67.5°, 112.5°).

At 630, the input RF signal is directed through the selected phase delay loads. This results in a coarse phase shift being performed on the input RF signal, as indicated at 640. At 650, a control voltage is supplied to an analog shifter, such as a varactor. As previously discussed, a voltage can be supplied to adjust the junction capacitance of the varactor. At 660, the control voltage is used to variably shift the phase of the input RF signal relative to the coarse phase shift. According to various embodiments, the amount of variable phase shift available from the varactor can vary relative to the coarse phase shift from a negative value (e.g., coarse phase shift−variable phase shift) to a positive value (e.g., coarse phase shift+variable phase shift). The phase shift range of the varactor can therefore be completely negative, completely positive, or both negative and positive relative to the coarse phase shift. At 670, the phase shifted RF signal is output via the input/output port of the digital-analog phase shifter.

Figure 7:
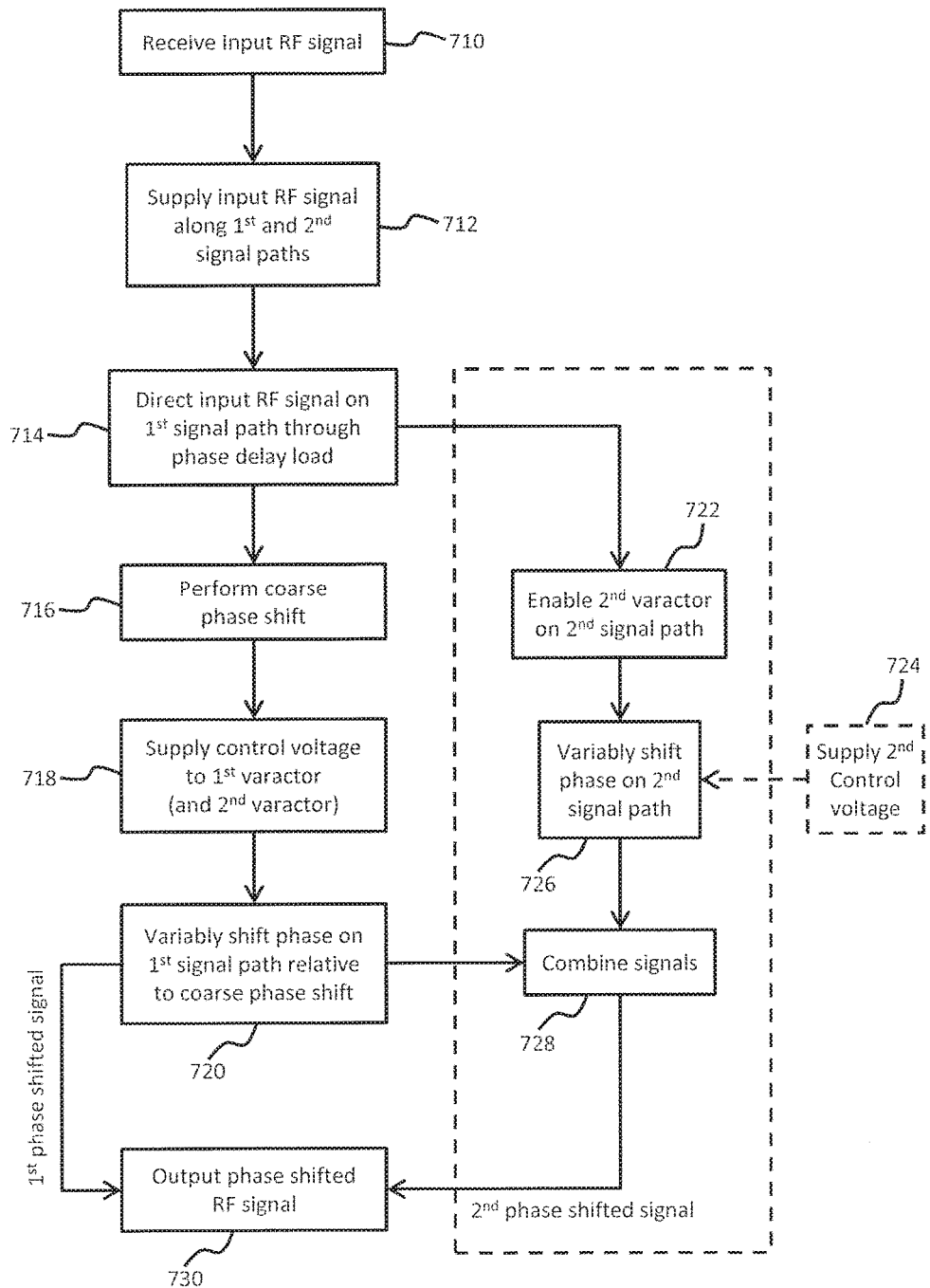
FIG. 7 is a flowchart of a process for shifting the phase of an input signal according to one or more embodiments.

FIG. 7 is a flowchart illustrating a process for shifting the phase of an input signal (e.g., an RF signal) in accordance with various embodiments. At 710, an input RF signal is received at an input/output port of the digital-analog phase shifter. At 712, the input RF signal is supplied to two separate signal paths, namely a first signal path and a second signal path. According to at least one embodiment, the input/output port can be configured to split the input RF signal such that it is supplied over both the first and second signal paths. According to other embodiments, however, a separate component such as a diplexer or splitter/combiner can be used to supply the input RF signal along the first and second signal paths. At 714, the input RF signal on the first signal path is directed through a phase delay load. This results in a coarse phase shift being performed on the input RF signal, as indicated at 716.

At 718, a control voltage is supplied to a first analog shifter, such as a first varactor. At 720, the control voltage causes the phase of the input RF signal to be variably shifted relative to the coarse phase shift experienced through the phase delay load. As previously discussed, the amount of variable phase shift available from the first varactor can vary from a negative value to a positive value, relative to the coarse phase shift. A first phase shifted RF signal is output along the first signal path based on the coarse phase shift and the variable phase shift from the first varactor. At 730, the first phase shifted signal is output as the phase shifted RF signal. This represents a first phase shift range for the RF signal.

According to various embodiments, a second phase shift range can be generated so that the input RF signal can be phase shifted over the entire 360° range. At 722, a second analog shifter (e.g., a second varactor) that is on the second signal path is enabled. According to various embodiments, the digital shifter may include a switching element (e.g., a pin diode) in addition to the phase delay load. The switching element can be used to selectively supply the second input RF signal to the second varactor. More particularly, in the ON position, the switching element connects the second signal path to the second varactor. In the OFF position, the switching element disconnects the second signal path from the second varactor and no additional phase shift is performed on the first signal path.

A control voltage is then applied to the second varactor. According to at least one embodiment, the control voltage can be the same control voltage that is supplied to the first varactor at 718. According to other embodiments, however, a second control voltage, that is independently controlled from the first control voltage, can be supplied to the second varactor. This is indicated at 724. Thus, one voltage controller can be used to supply the same control voltage to both the first varactor and the second varactor. Alternatively, two different voltage controllers can be used to independently supply control voltages to the first varactor and second varactor. The first and second control voltages, therefore, can be equal to each other, or different from each other. Additionally, it is possible to have the first and second voltages equal each other despite the use of separate voltage controllers.

At 726, the phase of the input RF signal traveling on the second signal path is variably shifted based on the supplied control voltage. This produces a second phase shifted signal. At 728, the first phase shifted signal (traveling on first signal path) and the second phase shifted signal (travelling on the second signal path) are combined. Depending on the specific implementation, this can be accomplished by the input/output port or a separate component such as a diplexer or splitter/combiner. It should be noted that when the switching element connects the second signal path to the second varactor, the phase shifted RF signal no longer corresponds to the first phase shifted signal alone. Rather, the first and second phase shifted signals are combined, and output as the phase shifted RF signal at 730.

Various features described herein may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. For example, such hardware can be interfaced to control the switching elements (e.g., pin diodes, MOSFETs, BJTs, etc.) in the digital shifter and the phase delay loads. Such hardware can also be interfaced to supply the control voltage to the analog shifter, or to control various features of the voltage controllers. Additionally, such hardware can be used to select phase shift ranges that facilitate lower signal loss in embodiments that incorporate overlapping regions.

The terms software, computer software computer program, program code, and application program may be used interchangeably and are generally intended to include any sequence of machine or human recognizable instructions intended to program/configure a computer, processor, server, etc. to perform one or more functions. Such software can be rendered in any appropriate programming language or environment including, without limitation: C, C++, C#, Python, R, Fortran, COBOL, assembly language, markup languages (e.g., HTML, SGML, XML, VoXML), Java, JavaScript, etc. As used herein, the terms processor, microprocessor, digital processor, and CPU are meant generally to include all types of processing devices including, without limitation, single/multi-core microprocessors, digital signal processors (DSPs), reduced instruction set computers (RISC), general-purpose (CISC) processors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components. Such exemplary hardware for implementing the described features are detailed below.

Figure 8:
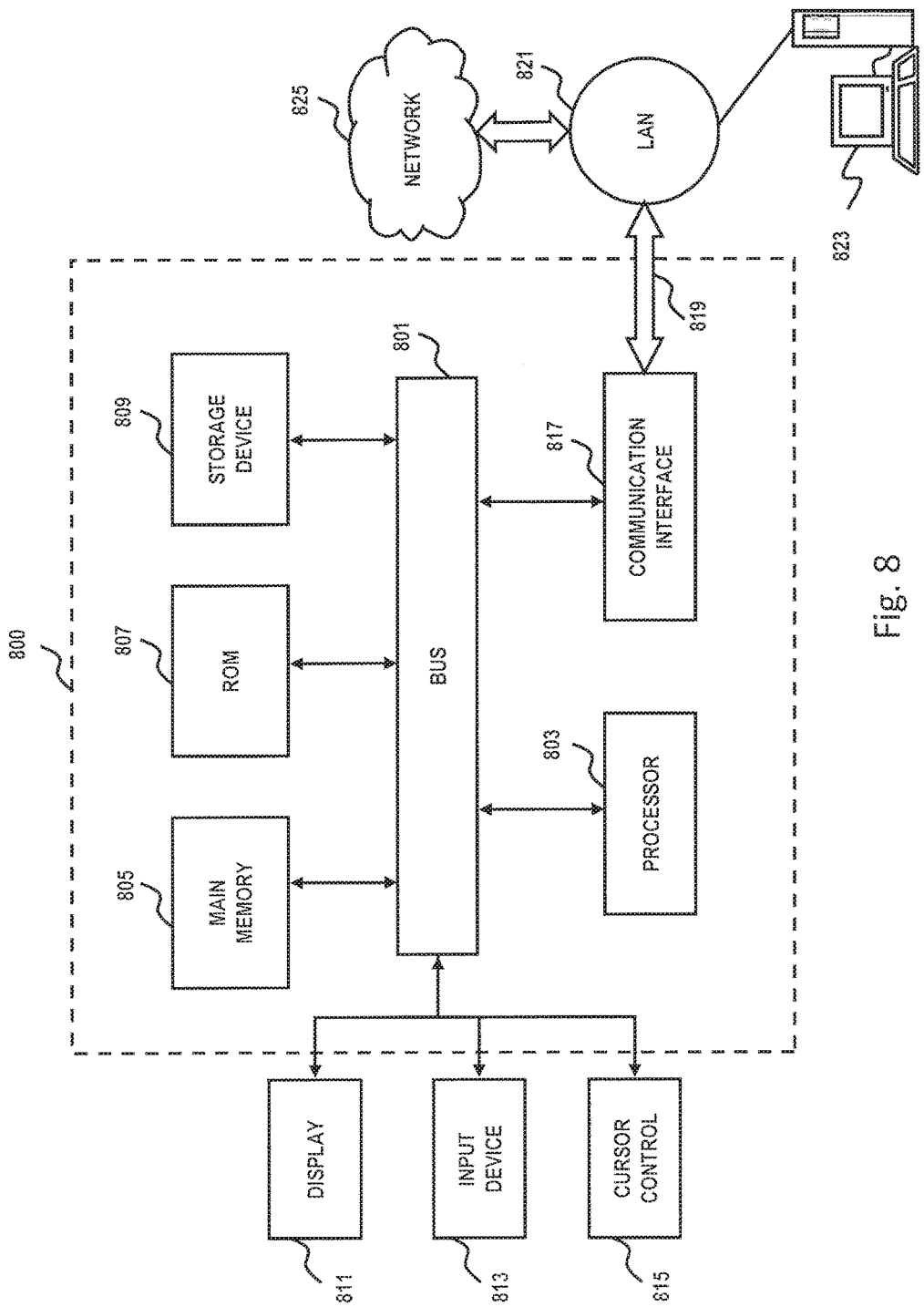
FIG. 8 is a diagram of a computer system that can be used to implement various features of exemplary embodiments.

FIG. 8 is a diagram of a computer system that can be used to implement features of various embodiments. The computer system 800 includes a bus 801 or other communication mechanism for communicating information and a processor 803 coupled to the bus 801 for processing information. The computer system 800 also includes main memory 805, such as a random access memory (RAM), dynamic random access memory (DRAM), synchronous dynamic random access memory (SDRAM), double data rate synchronous dynamic random-access memory (DDR SDRAM), DDR2 SDRAM, DDR3 SDRAM, DDR4 SDRAM, etc., or other dynamic storage device (e.g., flash RAM), coupled to the bus 801 for storing information and instructions to be executed by the processor 803. Main memory 805 can also be used for storing temporary variables or other intermediate information during execution of instructions by the processor 803. The computer system 800 may further include a read only memory (ROM) 807 or other static storage device coupled to the bus 801 for storing static information and instructions for the processor 803. A storage device 809, such as a magnetic disk or optical disk, is coupled to the bus 801 for persistently storing information and instructions.

The computer system 800 may be coupled via the bus 801 to a display 811, such as a light emitting diode (LED) or other flat panel displays, for displaying information to a computer user. An input device 813, such as a keyboard including alphanumeric and other keys, is coupled to the bus 801 for communicating information and command selections to the processor 803. Another type of user input device is a cursor control 815, such as a mouse, a trackball, or cursor direction keys, for communicating direction information and command selections to the processor 803 and for controlling cursor movement on the display 811. Additionally, the display 811 can be touch enabled (i.e., capacitive or resistive) in order facilitate user input via touch or gestures.

According to an exemplary embodiment, the processes described herein are performed by the computer system 800, in response to the processor 803 executing an arrangement of instructions contained in main memory 805. Such instructions can be read into main memory 805 from another computer-readable medium, such as the storage device 809. Execution of the arrangement of instructions contained in main memory 805 causes the processor 803 to perform the process steps described herein. One or more processors in a multi-processing arrangement may also be employed to execute the instructions contained in main memory 805. In alternative embodiments, hard-wired circuitry may be used in place of or in combination with software instructions to implement exemplary embodiments. Thus, exemplary embodiments are not limited to any specific combination of hardware circuitry and software.

The computer system 800 also includes a communication interface 817 coupled to bus 801. The communication interface 817 provides a two-way data communication coupling to a network link 819 connected to a local network 821. For example, the communication interface 817 may be a digital subscriber line (DSL) card or modem, an integrated services digital network (ISDN) card, a cable modem, fiber optic service (FiOS) line, or any other communication interface to provide a data communication connection to a corresponding type of communication line. As another example, communication interface 817 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 817 sends and receives electrical, electromagnetic, or optical signals that carry digital data streams representing various types of information. Further, the communication interface 817 can include peripheral interface devices, such as a Universal Serial Bus (USB) interface, a High Definition Multimedia Interface (HDMI), etc. Although a single communication interface 817 is depicted in FIG. 8, multiple communication interfaces can also be employed.

The network link 819 typically provides data communication through one or more networks to other data devices. For example, the network link 819 may provide a connection through local network 821 to a host computer 823, which has connectivity to a network 825 such as a wide area network (WAN) or the Internet. The local network 821 and the network 825 both use electrical, electromagnetic, or optical signals to convey information and instructions. The signals through the various networks and the signals on the network link 819 and through the communication interface 817, which communicate digital data with the computer system 800, are exemplary forms of carrier waves bearing the information and instructions.

The computer system 800 can send messages and receive data, including program code, through the network(s), the network link 819, and the communication interface 817. In the Internet example, a server (not shown) might transmit requested code belonging to an application program for implementing an exemplary embodiment through the network 825, the local network 821 and the communication interface 817. The processor 803 may execute the transmitted code while being received and/or store the code in the storage device 809, or other non-volatile storage for later execution. In this manner, the computer system 800 may obtain application code in the form of a carrier wave.

The term "computer-readable medium" as used herein refers to any medium that participates in providing instructions to the processor 803 for execution. Such a medium may take many forms, including but not limited to non-volatile media, volatile media, and transmission media. Non-volatile media include, for example, optical or magnetic disks, such as the storage device 809. Non-volatile media can further include flash drives, USB drives, microSD cards, etc. Volatile media include dynamic memory, such as main memory 805. Transmission media include coaxial cables, copper wire and fiber optics, including the wires that comprise the bus 801. Transmission media can also take the form of acoustic, optical, or electromagnetic waves, such as those generated during radio frequency (RF) and infrared (IR) data communications. Common forms of computer-readable media include, for example, a USB drive, microSD card, hard disk drive, solid state drive, optical disk (e.g., DVD, DVD RW, Blu-ray), or any other medium from which a computer can read.

Figure 9:
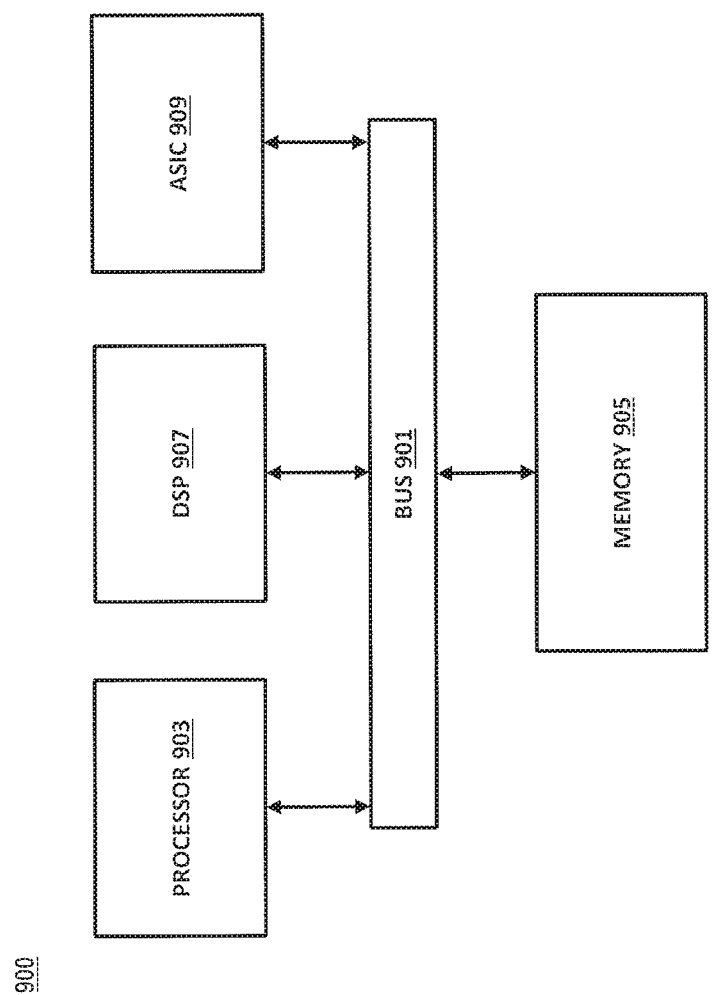
FIG. 9 is a diagram of a chip set that can be used to implement various features of exemplary embodiments.

FIG. 9 illustrates a chip set 900 upon which features of various embodiments may be implemented. Chip set 900 is programmed to implement various features as described herein and includes, for instance, the processor and memory components described with respect to FIG. 9 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 900, or a portion thereof, constitutes a means for performing one or more steps of the figures.

In one embodiment, the chip set 900 includes a communication mechanism such as a bus 901 for passing information among the components of the chip set 900. A processor 903 has connectivity to the bus 901 to execute instructions and process information stored in, for example, a memory 905. The processor 903 may include one or more processing cores with each core configured to perform independently. A multi-core processor enables multiprocessing within a single physical package. Examples of a multi-core processor include two, four, eight, or greater numbers of processing cores. Alternatively or in addition, the processor 903 may include one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM, magnetic disk, re-writable optical disk, etc.) and static memory (e.g., ROM, CD-ROM, DVD, BLU-RAY disk, etc.) for storing executable instructions that when executed perform the inventive steps described herein to controlling a set-top box based on device events. The memory 905 also stores the data associated with or generated by the execution of the inventive steps.

While certain exemplary embodiments and implementations have been described herein, other embodiments and modifications will be apparent from this description. Accordingly, the various embodiments described are not intended to be limiting, but rather are encompassed by the broader scope of the presented claims and various obvious modifications and equivalent arrangements.

What is claimed is:

1. A method comprising:
receiving an input RF signal from an external source;
supplying the input RF signal along a first signal path and along a second signal path;
performing a coarse phase shift of the input RF signal on the first signal path using a digital shifter;
variably shifting the phase of the input RF signal on the first signal path within a predetermined range relative to the coarse phase shift, using a first analog shifter, to produce a first phase shifted signal;
selectively enabling a second analog shifter;
variably shifting the phase of the input RF signal on the second signal path within a predetermined range to produce a second phase shifted signal; and
outputting a phase shifted RF signal,
wherein the phase shifted RF signal comprises at least one of the first phase shifted RF signal, and both the first phase shifted signal and the second phase shifted signal, and
wherein the total phase range of the phase shifted RF signal that is output is continuously variable from 0° to 360°.

2. The method of claim 1, wherein performing a coarse phase shift further comprises providing a phase delay load for shifting the phase of the input RF signal by preset value.

3. The method of claim 1, wherein a total loss of the phase shifted RF signal is between odB to −1.7 dB.

4. The method of claim 1, wherein:
the first analog shifter comprises a first varactor; and
variably shifting the phase of the input RF signal on the first signal path comprises supplying a first voltage to variably control capacitance of the first varactor.

5. The method of claim 4, wherein:
the second analog shifter comprises a second varactor; and
variably shifting the phase of the input RF signal on the second signal path comprises supplying the first voltage to variably control capacitance of the second varactor.

6. The method of claim 4, wherein:
the second analog shifter comprises a second varactor; and
variably shifting the phase of the input RF signal on the second signal path comprises supplying a second voltage to variably control capacitance of the second varactor.

7. An apparatus comprising:
an input/output port configured to:
receive an input RF signal from an external source,
supply the input RF signal along a first signal path and along a second signal path, and
output a phase shifted RF signal;
a digital shifter for selectively performing a coarse phase shift of the input RF signal on the first signal path;
a first analog shifter for variably shifting the phase of the input RF signal on the first signal path within a predetermined range relative to the coarse phase shift to produce a first phase shifted signal; and
a second analog shifter for variably shifting the phase of the input RF signal on the second signal path within a predetermined range to produce a second phase shifted signal,
wherein the phase shifted RF signal output by the input/output port comprises at least one of the first phase shifted signal, and both the first phase shifted signal and the second phase shifted signal, and
wherein the total phase range of the phase shifted RF signal that is output is continuously variable from 0° to 360°.

8. The apparatus of claim 7, wherein the digital shifter comprises:

a phase delay load for shifting the phase of the input RF signal on the first signal path by a preset value; and a switch for selectively directing the input RF signal on the second signal path to the second analog shifter or shorting the second signal path.

9. The method of claim 7, wherein a total loss of the phase shifted RF signal is between 0dB to −1.7 dB.

10. The apparatus of claim 7, wherein:

the first analog shifter comprises a first varactor having a capacitance that is variably controlled by a first voltage; and the second analog shifter comprises a second varactor having a capacitance that is variably controlled by a second voltage.

11. The apparatus of claim 10, wherein the first voltage and the second voltage are equal.

12. The apparatus of claim 10, wherein the first voltage and the second voltage are different.

13. The apparatus of claim 7, further comprising a controller for controlling the capacitance of at least one of the first analog shifter and the second analog shifter.

\* \* \* \* \*